United States Patent [19]

Zupancic

[11] Patent Number: 5,185,210

[45] Date of Patent: Feb. 9, 1993

[54] PHOTODEFINABLE INTERLEVEL DIELECTRICS

[75] Inventor: Joseph J. Zupancic, Bensenville, Ill.

[73] Assignee: Allied-Signal Inc., Morris Township, Morris County, N.J.

[21] Appl. No.: 676,667

[22] Filed: Mar. 28, 1991

[51] Int. Cl.$^5$ ............................................. B32B 27/42
[52] U.S. Cl. .................................... 428/457; 156/655; 427/510; 428/460; 522/166; 526/247
[58] Field of Search .................. 428/457, 460; 427/43, 427/43.1; 156/655; 526/247; 522/166

[56] References Cited

U.S. PATENT DOCUMENTS

| | | | |
|---|---|---|---|
| 4,816,498 | 3/1989 | Zupancic et al. | 522/166 |
| 4,855,375 | 8/1989 | Zupancic et al. | 526/247 |
| 4,908,096 | 3/1990 | Zupancic | 156/655 |

*Primary Examiner*—D. S. Nakarani
*Attorney, Agent, or Firm*—Harold N. Wells; Mary Jo Boldingh; Gerhard H. Fuchs

[57] ABSTRACT

A predetermined pattern of a dielectric polymer is formed on a substrate from a mixture of prepolymers which are the ethers of the oligomeric condensation product of (a) dihydric phenol and formaldehyde and (b) a dialdehyde and 3 to 4 moles of a phenol.

2 Claims, No Drawings

PHOTODEFINABLE INTERLEVEL DIELECTRICS

PRIOR ART

This invention relates to materials used to provide isolation of conductive layers in microelectronic circuitry. In particular, it relates to polymeric materials which can be photopolymerized so that dielectric layers can be formed where desired in multilayer structures. Such layers must be excellent insulators, have good chemical resistance and, of course, must adhere to the substrate on which they are placed.

Polyimides have been used for such dielectrics since they have superior temperature and chemical resistance compared to many other polymers. Literature and patents disclosing of the use of polyimides are extensively discussed by the present inventor in U.S. Pat. No. 4,908,096, which is incorporated herein by reference. The disadvantages of the polyimides are discussed, namely, that they release large amounts of volatiles during curing, absorb moisture, have poor adhesion, and have a relatively high coefficient of expansion. The patent discloses and claims the use of other polymers as interlevel dielectrics having improved properties, namely, vinylbenzyl or alkyl ethers of the condensation products of dialdehydes and phenols.

The present invention relates to other polymers which have been found to provide useful interlevel dielectrics.

In U.S. Pat. No. 4,855,375 the present inventor has disclosed oligomers which are ethers of bisphenols and formaldehyde which have application to making laminated boards for electronic applications. The patent is incorporated by reference herein. In U.S. Pat. No. 4,816,498, incorporated by reference herein, another family of oligomeric condensation products was disclosed which differ from those just discussed in being the condensation products of dialdehydes with 3 to 4 moles of phenols. These oligomers also are etherified to provide a mixture of vinylbenzyl and alkyl ethers. They may be used to make laminated boards for electronic applications. Both of such oligomers now have been found to be useful as interlevel dielectrics, as will be seen in the discussion below. Related polymers are disclosed in co-pending U.S. patent applications Ser. Nos. 07/629,786 and 07/630,118.

SUMMARY OF THE INVENTION

This invention comprises a method of forming a predetermined pattern from a polymer on a substrate and the thus-created dielectric layers.

Such patterns are created by coating onto the substrate a prepolymer and then irradiating the exposed portions of a masking pattern to render the prepolymer insoluble, then selectively dissolving the non-irradiated masked portions of the coating leaving the insoluble irradiated prepolymer, and curing the irradiated prepolymer to form an infusible glassy solid in the predetermined pattern.

The prepolymer is a mixture of two oligomers. One is an ether of the oligomeric condensation product of a dihydric phenol and formaldehyde having the formula

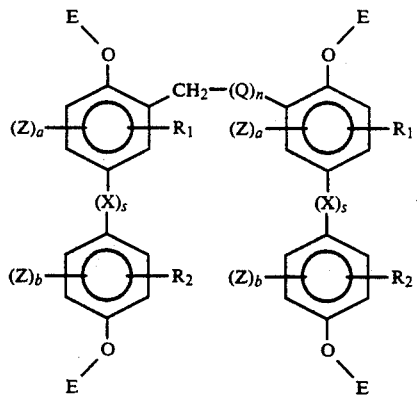

where the recurring unit Q has the structure,

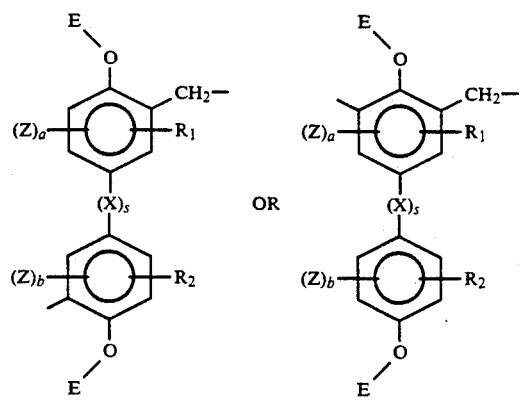

and n is an integer from 1 to 10;
s is 0 or 1;
each X is independently selected from the group consisting of $CH_2$, $C(CH_3)_2$, O, S, $SO_2$, CO, and $OC_6H_4O$;
each $R_1$ and $R_2$ is independently selected from the group consisting of hydrogen, alkyl and alkoxy moieties containing 1 to 10 carbon atoms, phenyl and phenoxy;
a and b are independently 0 or integers from 1 to 4;
Z is Cl or Br;
E is selected from the group consisting of the vinylbenzyl moiety, alkyl moieties containing 1 to 10 carbon atoms, or benzyl, subject to the constraint that at least 50% of all E's are the vinylbenzyl moiety.

In a preferred embodiment, E is at least 70% vinyl benzyl and the remaining E's are propyl and X is $C(CH_3)_2$ or both $C(CH_3)_2$ and CO.

The second oligomer is an ether of the oligomeric condensation product of (a) 1 molar proportion of a dialdehyde and (b) from about 3 to about 4 molar proportions of a phenol; where the dialdehyde is selected from the group consisting of $OHC(CH_2)_mCHO$, where m=0 or an integer from 1 to 6, cyclopentanedialdehyde, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde; where the phenol has the structure $R_3C_6H_4OH$ and where $R_3$ is hydrogen or an alkyl group containing from 1 to about 10 carbon atoms; and where the phenol residue of said oligomeric condensation product is etherified with one or more substituents to afford ether moieties randomly selected from the group consisting of vinylbenzyl, alkyl moieties containing from 1 to 10 carbon atoms, cycloalkyl moieties from 5 to 10 carbon atoms, and benzyl, with the ratio of vinylbenzyl to other moieties being from 1:1 to about 6:1.

DESCRIPTION OF THE PREFERRED EMBODIMENTS

Polymeric Resins

In U.S. Pat. No. 4,855,375, the present inventor disclosed the preparation and use of the ethers of the oligomeric condensation products of a dihydric phenol and formaldehyde and their use in composites, especially laminated boards for electronic uses. It has now been found that these compositions can be used as interlevel dielectrics in combination with the oligomers of U.S. Pat. No. 4,816,498, where they have the advantages of low water absorption, low dielectric constant, low coefficients of thermal expansion, high glass transition temperature, high thermal stability, high solids coating concentrations, and are photochemically curable, thermally curable, and generate little or no volatiles during the cure process. The prepolymers used in forming a pattern are of two types. The first has the formula:

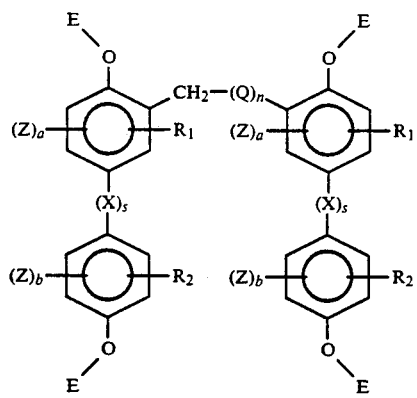

They result from the etherification of oligomers which are the condensation product of a dihydric phenol and formaldehyde. The product will be a mixture of oligomers with varying molecular weight. The number, n, of recurring units Q generally will vary from 1 to 10. Preferably, n is 1 or an integer from 1 to 6 and the number average of n is about 3.

The recurring unit Q itself has the structure,

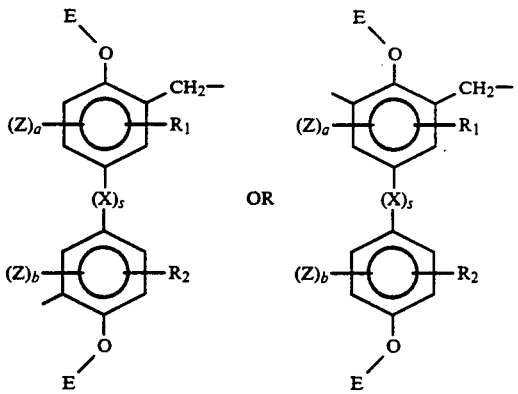

Note that the condensation may occur either on the same ring, as in the right hand structure, or in different rings, as in the left hand structure. The aromatic rings in the recurring unit Q are either joined directly or are separated by an intervening moiety X, that is, S is 0 or 1. Each of the moieties X is either methylene [$CH_2$], isopropylidine [$C(CH_3)_2$], an oxygen, sulfur, sulfonyl [$SO_2$], carbonyl [$CO$], or a dioxyphenylene group [$OC_6H_4O$] where the oxygens of the latter generally are para or meta to each other. Preferably X is $C(CH_3)_2$ or both $C(CH_3)_2$ and $CO$.

Each of the aromatic rings may bear substituents or may be completely unsubstituted. Thus, $R_1$ and $R_2$ are independently selected from moieties such as hydrogen, alkyl moieties containing from 1 to 10 carbon atoms, the phenyl moiety, alkoxy moieties containing from 1 to 10 carbon atoms, and phenoxy, $C_6H_5O$. Examples of suitable alkyl moieties include methyl, ethyl, propyl, butyl, pentyl, hexyl, heptl, octyl, nonyl, and decyl moieties. The methyl and tert-butyl groups are preferred alkyl moieties, although the variant where $R_1=R_2=H$ is quite desirable.

The basic resins can be modified to be flame retardant by incorporating halogen atoms into the aromatic rings. Thus, Z may be a halogen atom, especially bromine, and where the aromatic ring is halogenated a and b are integers from 1 to 4. Polyhalogenated materials are preferred as flame retardants, and thus a and b are recommended to be 2, 3, or 4.

The oligomeric condensation products have a multiplicity of phenolic hydroxyl groups substantially all of which are end-capped as ether groups in our interlevel dielectric resins. The best case results where the ether portion, E, is a vinylbenzyl moiety, that is, of the structure.

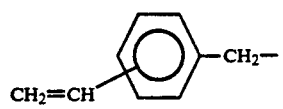

which may be either the meta- or para-isomer, and which usually is a mixture of the meta- and para-isomers. Although it is desirable to have all the phenolic hydroxyls end-capped with vinylbenzyl moieties, there is a cost advantage when fewer than all of the ether groups are vinylbenzyl, but usually at the expense of a somewhat lower dielectric constant. At least 50% of the E moieties should be a vinylbenzyl moiety, but better performance characteristics result when from 70 to 100% of the ether groups are vinylbenzyl, and the best prepolymer product results when 95 to 100% of such groups are vinylbenzyl. However, for many applications less than complete end-capping with vinyl benzyl groups is acceptable, but all of the hydroxyl groups should be capped.

Where the ether groups include other than vinylbenzyl, then E is an alkyl group containing from 1 to 10 carbons or a benzyl group. Where E is an alkyl group, the primary alkyl groups are preferred, especially the primary lower alkyl groups containing from 1 to 4 carbon atoms. Thus, the most desirable alkyl groups consist of methyl, ethyl, 1-propyl, 1-butyl, and 1-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth.

In a preferred embodiment E is at least 70% vinyl benzyl and the remaining E's are propyl.

The second type of oligomers are ethers of oligomeric condensation products of 1 molar proportion of certain dialdehydes with from about 3 to about 4 molar proportions of a phenol. More particularly, the ether moiety is randomly selected from among the vinylbenzyl moiety, alkyl moieties containing from 1 to 10 carbon atoms, cycloalkyl moieties having from 5 to about 10 carbon atoms, and the benzyl moiety, where the ratio of the vinylbenzyl to other ether moieties is at least 1:1 and may be as great as 6:1.

The phenolic oligomers are the condensation products of 1 molar proportions of selected dialdehydes with 3 to 4 molar proportions of a phenol. Although more than 4 molar proportions of a phenol can be used in the practice of this invention, no more than 4 molar proportions will react with the dialdehydes.

On class of dialdehydes which may be used in this invention are the linear, terminal alkylene dialdehydes of formula $OHC(CH_2)_mCHO$ where m is 0 or an integer from 1 to 6. Such dialdehydes include glyoxal, malondialdehyde, succinidialdehyde, glutaraldehyde, adiphaldehyde, pimelaldehyde, and sebacaldehyde. Those aldehydes where m is 0–4 are particularly preferred, and glyoxal (m=0) is especially favored in the practice of this invention.

Other aldehydes which may be employed in preparation of the oligomeric condensation products include cyclopentanedialdehyde, phthalaldehyde, isophthaldehyde, terephthalaldehyde, the hexahydrophthalaldehydes (i.e., the reduced counterpart of the phthalaldehydes where the aromatic ring has been reduced to a cyclohexane ring), cycloheptanedialdehyde, and cyclooctanedialdehyde.

The oligomers are the condensation product of 1 molar proportion of the aforementioned dialdehydes with from 3 to about 4 molar proportions of a phenol. The phenol has the general structure $R_3C_6H_4OH$ where $R_3$ is hydrogen or an alkyl group containing from 1 through about 8 carbon atoms. The most desirable phenol is phenol itself, that is, the case where $R_3$ is hydrogen. Where $R_3$ is an alkyl group it is most desirable that the alkyl group contain from 1 to about 4 carbon atoms, and cresol, the case where $R_3$ is a methyl group is another preferred species of phenol.

The condensation product is analogous to phenol-formaldehyde resins. That is, the products result from the condensation of 2 molar proportions of a phenol with each aldehyde group. In the simplest case, which can be looked as the "monomeric" product, using phenol and glyoxal to exemplify the reaction, the product has the structure

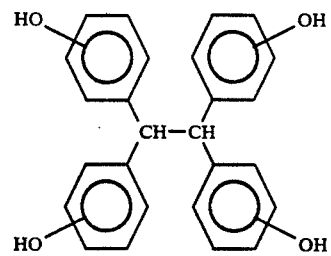

where the hydroxyls are almost exclusively ortho and para, and largely para, to the point of condensation of the phenol and glyoxal. However, the product above has 4 phenolic groups per molecule, and any one of these may react with another molecule of glyoxal which then further condenses with three other molecules of phenol to give the structure

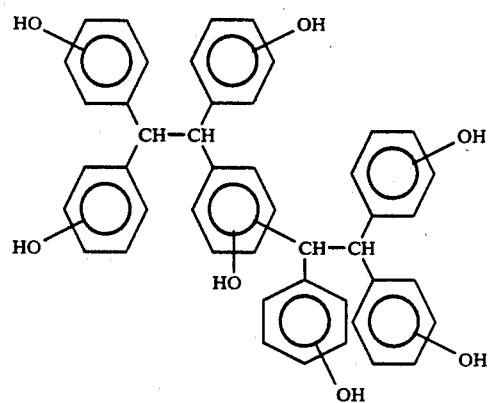

The oligomeric product above results from a molar proportion of 7 phenols to 2 glyoxals. This oligomer in turn can react with another molecule of glyoxal and the latter can react further with 3 additional phenols to give the next higher oligomer of the structure

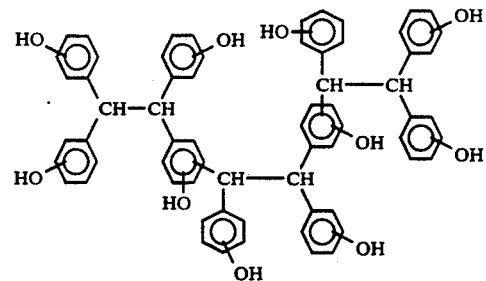

which has the molar ratio of 10 phenolic groups to 3 glyoxals. In a similar fashion, the next higher oligomer has a molar ratio of phenol to glyoxal of 13:4, the next higher of 16:5, and so forth, with the limiting molar ratio being 3:1. It needs to be mentioned that a ratio less than 3:1 will never be achieved without internal cyclization, i.e., one molecule of glyoxal is required to react with at least 2 phenolic moieties of the oligomer. In a similar fashion, the condensation product which is the "monomer" has a limiting ratio of phenol-glyoxal of 4:1.

The condensation products are themselves phenols, as mentioned above, and are a mixture of oligomers. This mixture can be characterized by the number of phenolic moieties per molecule. We are concerned with those condensation products which have from 4 to about 60 phenolic moieties per molecule, and more usually between four and about 22 phenolic moieties per molecule. The product being a mixture of oligomers, the preferred mixture is characterized by having as an average between about 5 and about 8 phenolic moieties per molecule.

More specifically, where the dialdehyde is glyoxal and the phenol is phenol itself each oligomeric product has a molecular weight between about 400 and 6000, and more desirably between about 400 and about 2200. The mixture of oligomeric products may be characterized by an average molecular weight of between about 500 and about 800.

The thermosetting resins of this invention are ethers of the aforedescribed oligomeric condensation products. In one variant of our invention the phenolic condensation products are halogenated prior to ether formation in order to make the final resins more flame retardant. Increased flame retardancy occurs especially when the halogen is chlorine or bromine, and the use of a brominated product is preferred. The halogen is introduced into positions ortho and para to the phenolic hydroxyl group. If all of the ortho and para positions are available a maximum of three halogen atoms per phenolic moiety may be introduced. Often it is desirable to prepare the maximally halogenated oligomeric condensation product, although at times a halogen content less than the maximum is advantageous. However, in the latter variant it should be clear that there is at least one chlorine or bromine atom per phenolic moiety. The phenolic condensation products are capped so as to convert substantially all (greater than about 99.5%) of the hydroxyls to ether moieties. Each of the ether moieties is randomly selected from the group consisting of vinylbenzyl, alkyl containing 1 to 10 carbon atoms, cycloalkyl of from 5 to 10 carbon atoms, and benzyl moieties as described above with respect to the first type of oligomer where the ratio of the vinylbenzyl to all other ether moieties is at least 1:1 and may be as high as 6:1.

The prepolymers may be prepared by acid catalyzed condensation of dihydric phenols with formaldehyde followed by end-capping substantially all the phenolic hydroxyls by converting them to ethers. Acid catalyzed condensation is preferred to avoid the formation of terminal hydroxyl methylene groups,—$CH_2OH$. End-capping by ether formation can be effected by any suitable means, such as by reacting the phenolic condensation product with an alkyl or benzyl halide in a basic medium.

The resulting thermosetting oligomers may be polymerized with attendant crosslinking by a variety of curing means. When curing is effected by thermal means, it generally is autoinitiated by heating the oligomer resin in air or an inert atmosphere at a temperature between about 100° and 300° C., and more particularly between about 120 and 300 C. Curing also may be brought about by chemical means using a free radical initiator such as azo-bis-isobutyronitrile, benzoyl peroxide, di-t-butyl peroxide, etc. In the present invention curing is begun by irradiation, especially by visible and ultraviolet light in the presence or absence of a sensitizer or photoinitiator, followed by thermal curing to produce an infusible, insoluble glassy solid.

Photodefinable Applications

The oligomers may be used as a passivant, as an interlevel dielectric, as a means of providing device deep dielectric isolation (insulator isolating trenches), as a high temperature solder mask, a photoresist, etc. Although much of what follows describes its use primarily as an interlevel dielectric, the skilled worker will recognize from this description how to use the materials of the invention in other applications as well.

The oligomers are applied as a coating to a suitable substrate. Preferably, the coating will have a thickness of 2 to 15 μm, most preferably 5 to 10 μm. For the most part the substrates used will be a silicon wafer, a silicon chip of an integrated circuit, a printed circuit board or a ceramic substrate. The photosensitive oligomers may be applied by spin coating, spray coating, by use of a doctor knife, or any other conventional techniques known in the art to obtain a uniform coating. Where the viscosity is too high, a solution of the resin in a suitable solvent may be used. The oligomers are soluble in a broad class of solvents including polar aprotic solvents, aromatic hydrocarbons, halogenated hydrocarbons, ketones, ester, and so forth. Examples of solvents which may be employed in the practice of our invention include dimethylformamide (DMF), hexamethylphosphoramide (HMPA), N-methylacetamide (NMAc), N,N-dimethylacetamide (DMAc), dimethylsulfoxide (DMSO), N-methylpyrrolidone (NMP), benzene, toluene, xylene, ethylbenzene, cumene, dichloromethane, chloroform, carbon tetrachloride, chlorobenzene, tetrachloroethane,tetrachloroethylene,trichloroethane, gamma-butyrolactone, methyl ethyl ketone, diethyl ketone, hexanone, heptanone, octanone, methyl acetate, ethyl acetate, butyl acetate, 2-methoxyethyl acetate, methoxy ethanol, ethoxy ethanol, diglyme, triglyme, and so forth. The solvent should be unreactive with both the substrate and the photosensitive oligomers and able to dissolve the resins to provide at least about a 10 weight-volume percent solution. Since the solvent is typically removed prior to further processing, it is also preferable that as low boiling a solvent as possible be used consistent with the foregoing considerations.

Although the oligomers may be photopolymerized directly, a photosensitizer or photoinitiator may be used and may be useful to decrease irradiation time. Where a photosensitizer or photoinitiator is used it will be added with the oligomers at the coating stage and will be present in an amount from about 0.001 to about 5.0 weight percent relative to the oligomers. Examples of photosensitizers or photoinitiators which may be successively used in the practice of this invention include such materials as benzophenone, 4,4'-bis(dimethylamino)benzophenone, 4,4' -dimethoxybenzophenone, xanthone, acetophenone, 4-trifluoromethylacetophenone, triphenylene, thioxanthone, anthraquinone, 4-phenylbenzophenone, naphthalene, 2-acetonaphthalene, 1-acetonaphthalene, chrysene, anthracene, 9,10-dichloroanthracene, pyrene, triphenylene, 1-fluoronaphthalene, 1-chloronaphthalene, 1-bromonaphthalene, 1-iodonaphthalene, 1,3-dicyanobenzene, dimethyl isophthalate, diethyl isophthalate, methyl 3-cyano-benzoate, ethyl 3-cyanobenzoate, phenyl 3-cyano-benzoate, 2,2-dimethoxyacetophenone, 2,2-diethoxyacetophenone, 2,2'-dimethoxy-2-phenylacetophenone, 2,2'-diethoxy-2-phenylacetophenone, benzoin methyl ether, and 1-phenyl-1,2-propanedione-2-O-benzoyloxime. Preferred sensitizers include benzophenone, 4,4'bis(dimethylamino)benzophenone, 1,3-dicyanobenzene, dimethyl isophthalate, diethyl isophthalate, methyl 3-cyano-benzoate, and phenyl 3-cyano-benzoate.

Where the photosensitive oligomers have been applied as a solution to the substrate the solvent used must be removed prior to irradiation. Consequently, it is conventional to heat the coated substrate for a time sufficient to remove essentially all of the solvent present, if any, prior to irradiation, a stage known as the "softbake." It is for this reason that the use of a low boiling solvent is preferred. It is acceptable to use enough heat to provide a semicured coating, especially since the oligomers may begin to cure at temperatures as low as about 110° C. The softbake can be carried out in vacuum, under an inert atmosphere (e.g., nitrogen, helium, argon, etc.) or in air.

A mask containing the desired pattern or image is placed in contact or in proximity to the coated substrate and the oligomeric coating is then irradiated through the mask by x-ray, electron beam, ion beam, ultraviolet, or visible radiation. For reasons of economy and ease of fabrication it is preferred to use radiation in the range from about 200 to about 800 nanometers. Since lower wave length radiation tends to afford better resolution, irradiation in the 200-500 nm range is preferred. With this treatment the irradiated portion of the coating becomes crosslinked so that the photocrosslinked oligomer is rather insoluble in the same solvent in which the original photosensitive oligomers remain quite soluble.

Irradiation may be done in either the presence or absence of oxygen. Exposure time necessary for adequate photocrosslinking to afford the differential solubility characteristic sought depends upon the wavelength of the light used, its intensity, the presence or absence of a photosensitizer or photoinitiator, and so forth, with a variation from a few seconds up through several minutes. For production purposes the shorter exposure times are highly preferred. One desirable characteristic of the photosensitive oligomers of this invention is that they photochemically crosslink throughout the thickness of the film. Therefore, the pattern shows no or minimal undercutting upon development.

The selective pattern appears upon development with the solvent. As mentioned above, upon irradiation the photosensitive oligomeric resin becomes extensively crosslinked with a subsequent large differential solubility between the crosslinked, or irradiated, and non-crosslinked, or non-irradiated, portions of the oligomers. The solvents used in the development are in general the same ones used in preparing a solution of the oligomers for coating purposes. Thus, classes of solvents include aprotic solvents, aromatic hydrocarbons, halogenated hydrocarbons, ketones, esters, the glymes, the Carbitols, mixed solvent systems, and the like.

Upon development selective patterns appear where the elevated portions correspond to the photochemically crosslinked oligomers. These relief structures are then thermally cured to afford a highly crosslinked, infusible, glassy solid highly resistant to elevated temperatures, chemical degradation, ion transport, and which serves as an effective protective layer and dielectric insulator. Curing is attended by crosslinking of the vinyl groups and may be effected either thermally, chemically, or photochemically, with thermal curing preferred. Thermal curing is generally done in the temperature range between about 100° C. and about 300° C., and often is done in stages. So, for example, curing may first be effected at a temperature between about 150° C. and about 200 C. for 0.5-5 hours with postcuring at about 180° C.-300° C. for about 0.5-24 hours. Curing also may be brought about using a free radical initiator, such as azo-bis-isobutyronitrile, benzoyl peroxide, di-t-butylperoxide, and so on.

The oligomers of the invention have been found particularly useful in photodefinable applications since they may be coated as solutions with high solids levels and thus less solvent must be evaporated. Also, since no volatile by-products are generated during curing the shrinkage of the films is minimized.

MULTILAYER PROCESSING

The substrate (i.e., ceramic, alumina, silicon, printed wiring board, etc.) may be cleaned with conventional cleaning solvents (e.g., methylene chloride, chloroform, Genesolv ®, trichloroethylene, ethanol, methanol, sodium bisulfite, sodium sulfite, potassium sulfite, etc.) employing normal cleaning processes as known in the art. In addition, the substrate may contain circuitry already deposited upon it. The substrate may be utilized after the cleaning process or may be surface treated to promote adhesion between the substrate and the metals and/or polymer dielectric layer.

If used, an adhesion promoter between the substrate and the dielectric layer may be chosen from a range of surface silylating agents containing reactive groups capable of reacting with the polymers of the invention. Examples of surface silylating agents which can be employed are: vinylmethyldimethoxysilane, vinyltrimethoxysilane, vinylmethyldiethoxysilane, vinyltriethoxysilane, diethoxymethylvinylphenethylsilane, dimethoxymethylvinylphenethylsilane, triethoxyvinylphenethylsilane, trimethoxyvinylphenethylsilane, etc. Preferred silylating agents are vinyl methyldimethoxysilane, vinylmethyldiethoxysilane, diethoxymethylvinylphenethylsilane, and dimethoxymethylvinylphenethysilane. The surface silylating agent would be applied to the substrate via dipping, spin coating, or other techniques from an alcohol-water solution. For example, a 1 to 10 wt. % solution of the silylating agent is dissolved in 85 to 98 wt. % of alcohol (e.g., methanol, ethanol, isopropanol, etc.) and 1 to 13 wt. % of water. The substrate is dipped in this solution for 15 seconds to 5 minutes, air dried for 1 minute to 5 hours, and then soft baked for 1 minute to 5 hours at 60° to 100° C. either in a convection oven, vacuum oven or hot plate.

The cleaned and/or surface treated substrate will be covered with a metal pattern before being covered with the dielectric layer of the invention. For example, a 500 to 1000 Å layer of chromium, 8000 to 20000 Å layer of copper and a 500 to 1000 Å layer of chromium may be sputtered onto the surface. Then, the metal layer is coated with a commercial photoresist and processed according to the recommended processing scheme utilizing a spin coat, soft bake, imaging, developing, and hard bake cycle. This exposes portions of the metal layer to be removed by etching to create the pattern. The metals are etched utilizing standard wet techniques, for example: The top chromium layer is etched with a 1 to 30% hydrochloric acid solution activated with aluminum for 10 seconds to 5 minutes; the copper layer is etched with a sodium persulfate solution for 10 seconds to 10 minutes; the bottom chromium layer is etched with a 1 to 30% hydrochloric acid solution activated with aluminum for 10 seconds to 5 minutes; and finally the etched substrate is washed with deionized water for 10 to 60 seconds. Then the remaining photoresist is stripped from the metal pattern as per the processing technique recommended for the photoresist. Finally the cleaned substrate is dried prior to the next processing step.

The dielectric layer is coated onto the substrate and its metal pattern and processed as follows: The prepolymer (e.g., 10 to 80 wt. %) in an appropriate solvent (toluene, NMP, DMF, etc.) is spin coated onto the substrate at a speed of 500 to 2500 rpm for 30 to 90 seconds; the prepolymer coated substrate is soft baked at a temperature of 25° to 60° C. for 15 minutes to 24 hours in a vacuum oven with or without a nitrogen bleed; the soft-baked coating is then imaged with a UV light source (220-320 nm range) for 15 seconds to 30 minutes employing a mask of desired design for vias and the like; the photocured polymer is then developed with an appropriate solvent system (e.g., toluene, toluene/hexane, toluene/ethanol, cyclohexane, ethylacetate, butylacetate, diglyme, etc.) at 25° to 35° C. with or without ultrasonics or via spraying for 5 to 120 seconds; the developed substrate can then be exposed to a stop or rinse bath or solvent spray based upon a solvent system miscible with the developing solvent but a poor solvent for the polymer system (for example hexane, pentane, ethanol, etc.) (optional step); the vias are then cleaned with a plasma or wet etch; and finally the dried substrate is hard baked in vacuum or under an inert atmosphere (nitrogen, argon, etc.) with a preferred cure cycle including a ramp from 25° to 300° C. for 30 minutes to 10 hours, a hold at 300° C. for 5 hours and then a cool down from 300° to 25° C. with a 30 minute to 10 hour ramp.

The process is repeated as required in order to form an electronic interconnect structure of desired electrical and dielectric levels.

EXAMPLE 1

Synthesis of Styrene Terminated Bisphenol-A-Formaldehyde (STBPA-F (100 VBz))

50.0 g of Bisphenol-A formaldehyde (BPA-F) ($Mn=394$, $Mw=680$, dispersity of 1.7) was dissolved in 220 mL of acetone in a 1000 mL 3-neck round bottom flask equipped with mechanical stirrer, thermometer, Therm-O-Watch, condenser, addition funnel and nitrogen purge. 66 mL (0.4644 moles) of vinylbenzylchloride (60/40 para/meta isomer ratio) was added to the reaction mixture and stirred for 30 minutes. The reaction mixture was heated to 65° C. and then 41.80 g (0.745 moles) of potassium hydroxide in 143 mL of methanol was added to the reaction mixture over a 1 Hr period. The reaction was refluxed for 1 Hr. with stirring, the reaction mixture was cooled to ambient temperature and allowed to stir for an additional 18 Hrs. The reaction mixture was recovered, dried over magnesium sulfate, filtered and concentrated under vacuum yielding a red resinous product of $Mn=501$, $Mw=778$, dispersity of 1.6.

EXAMPLE 2

Synthesis of Styrene Terminated Bisphenol-A-Formaldehyde (STBPA-F (70VBz/30Pr))

Bisphenol-A formaldehyde (BPA-F) was prepared as follows: 456.58 g (2.00 moles) of bisphenol-A, 90.00 g (3.00 mole of formaldehyde functionality) of paraformaldehyde, and 500 mL of ethanol were charged into a 2000 mL 3-neck flask equipped with a mechanical stirrer, thermometer, Therm-0-Watch, condenser, addition funnel and nitrogen purge. The reaction mixture was heated to 80° C., 2.00 mL of concentrated sulfuric acid was added dropwise over a 30 minute interval. The reaction was maintained at 80° C. for 1 day. The solvent was distilled from the reaction mixture with the reactor equipped with a Dean-Stark trap and then the resin was poured into an aluminum pan, yielding 508.7 g of resin, $Mn=740$, $Mw=8800$, dispersity of 12.0.

228.31 grams of the above BPA-F was dissolved in 700 mL of N-methylpyrrolidinone (NMP) in a 2000 mL 3-neck round bottom flask equipped with mechanical stirrer, addition funnel, condenser, thermometer, nitrogen purge and Therm-0-Watch. To this reaction mixture was added 213.67 g (1.400 moles) of vinylbenzylchloride (60/40 para/meta isomer ratio) and 0.10 g of 2,6-di-tert-butyl-p-cresol (BHT). The reaction mixture was heated to 60° C. and 98.2 g (1.750 moles) of potassium hydroxide in 325 mL of methanol was added dropwise over a 1.5 hr interval. The reaction was maintained at 60° C. for 19 hrs with stirring under a nitrogen purge. 99.63 g (0.810 moles) of n-propylbromide was added to the reaction mixture, to this reaction mixture was then added 45.45 g (0.810 moles) of potassium hydroxide in 150 mL of methanol over a 2 hr. interval, the reaction was maintained at 60° C. for 18 hrs. After cooling to room temperature the reaction mixture was transferred to a separatory funnel, 2 Liters of toluene was added and then washed four times with 2 Liters of water, dried over magnesium sulfate, filtered and stripped under vacuum, yielding 636.6 g of resin; $Mn=1100$, $Mw=18000$, dispersity of 17.0; IR indicates presence of no residual hydroxyl moieties.

EXAMPLE 3

Synthesis of Styrene Terminated Bisphenol-A-Formaldehyde (STBPA-F (70VBz/30Pr))

Bisphenol-A formaldehyde (BPA-F) was prepared as follows: 456.6 g (2.00 moles) of bisphenol-A, 45.04 g (1.50 mole of formaldehyde functionality) of paraformaldehyde, and 350 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 4.00 mL of concentrated sulfuric acid was added dropwise over a 5 minute interval. The reaction was maintained at 80° C. for 1 day. The solvent was distilled from the reaction mixture with the reactor equipped with a Dean-Stark trap and then the resin was poured into an aluminum pan, yielding 447.6 g of resin, $Mn=230$, $Mw=1400$, dispersity of 5.8.

228.29 grams of the above BPA-F was dissolved in 700 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 213.67 g (1.400 moles) of vinylbenzylchloride (60/40 para/meta isomer ratio) and 0.10 g of 2,6-di-tert-butyl-p-cresol (BHT). The reaction mixture was heated to 60° C. and 98.19 g (1.750 moles) of potassium hydroxide in 430 mL of methanol was added dropwise over a 2.0 hr interval. The reaction was maintained at 60° C. for 19 hrs with stirring under a nitrogen purge. 99.63 g (0.810 moles) of n-propylbromide was added to the reaction mixture, to this reaction mixture was then added 45.45 g (0.810 moles) of potassium hydroxide in 230 mL of methanol over a 1.25 hr. interval, the reaction was maintained at 60° C. for 18 hrs. Analysis of a small aliquot of the reaction mixture after work-up indicates residual hydroxyl groups. 9.96 g (0.081 moles) of n-propylbromide was added to the reaction mixture and then 4.54 g (0.081 moles) of potassium hydroxide in 30 mL of methanol was added to the reaction mixture and reacted 6 hrs. at 60° C. After cooling to room temperature the reaction mixture was transferred to a separatory funnel, 1.5 Liters of toluene was added and then washed four times with 1 Liter of water, dried over magnesium sulfate, filtered and stripped under vacuum, yielding 334.73 g of resin; $Mn=730$, $Mw=1800$, dispersity of 2.5; IR indicates presence of no residual hydroxyl moieties.

EXAMPLE 4

Synthesis of Styrene Terminated Bisphenol-A-Formaldehyde-Dihydroxybenzophenone (STBPA-F-BP (70VBz/30Pr))

Bisphenol-A-formaldehyde-dihydroxybenzophenone (BPA-F-BP) was prepared as follows: 433.75 g (1.90 moles) of bisphenol-A, 21.42 g (0.10 moles) of 4,4'-dihydroxybenzophenone, 69.07 g (2.30 moles of formaldehyde functionality) of paraformaldehyde, and 500 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 4.00 mL of concentrated sulfuric acid was added dropwise over a 3 minute interval. The reaction was maintained at 80° C. for 1 day. The solvent was distilled from the reaction mixture with the reactor equipped with a Dean-Stark trap and then the resin was poured into an aluminum pan, yielding 415.5 g of resin, Mn 300, Mw 2300, dispersity of 7.9.

228.29 grams of the above BPA-F-BP was dissolved in 700 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 213.67 g (1.400 moles) of vinylbenzylchloride (60/40 para/meta isomer ratio). The reaction mixture was heated to 60° C. and 98.19 g (1.750 moles) of potassium hydroxide in 375 mL of methanol was added dropwise over a 2.0 hr interval. The reaction was maintained at 60° C. for 19 hrs with stirring under a nitrogen purge. 99.63 g (0.810 moles) of n-propylbromide was added to the reaction mixture, to this reaction mixture was then added 45.45 g (0.810 moles) of potassium hydroxide in 250 mL of methanol over a 2 hr. interval, the reaction was maintained at 60° C. for 18 hrs. A small aliquot was removed from the reaction mixture, worked-up and IR analysis indicates residual hydroxyl moieties. 9.96 g (0.081 moles) of n-propylbromide was added to the reaction mixture, and then 4.54 g (0.081 moles) of potassium hydroxide in 20 mL of methanol was added and the reaction mixture was reacted for 18 hrs. After cooling to room temperature the reaction mixture was transferred to a separatory funnel, 1.5 Liters of toluene was added and then washed thrice with 1 Liter of water, dried over magnesium sulfate, filtered and stripped under vacuum, yielding 222.8 g of resin; $Mn=700$, $Mw=2400$, dispersity of 3.4; IR indicates presence of no residual hydroxyl moieties.

EXAMPLE 5

Synthesis of Styrene-Terminated Tetraphenol Ethane (70% Vinylbenzyl/30% Propyl) (STTPE(70 VBz/30 Pr))

To a 3000 mL round bottom, 3-neck flask equipped with a mechanical stirrer, addition funnel, condenser, thermometer, Therm-O-Watch, drying tube and nitrogen purge was added 353.0 g of tetraphenol ethane ($Mn=274$, $Mw=711$) (0.500 moles), 3.30 g of BHT (0.0150 moles) and 1670 mL of N-methyl pyrrolidinone (NMP). Upon dissolution of the TPE, 373.89 g (2.45 moles) of vinylbenzyl chloride (VBC) were added. The reaction mixture was heated to 60° C. and 160.25 g (2.500 moles) of potassium hydroxide in 360 mL of methanol were added dropwise over a 30 minute interval. The mixture was kept at 60° C. for an additional 3.5 hours, then 127.0 mL of 1-bromopropane (1.400 moles) was added. 68.68 g (1.070 moles) of potassium hydroxide in 150 mL of methanol was then added dropwise over a 30 minute interval and the temperature maintained at 60° C. and additional 1.5 hours.

The mixture was cooled and 2L of toluene were added. The mixture was washed once with 5L of water and thrice with 5L of 1 M sodium chloride solution. The organic phase was dried over sodium sulfate, filtered through Celite, filtered and concentrated under vacuum yielding 84% of resinous product, $Mn=576$, $Mw=915$, dispersity of 1.59.

EXAMPLE 6

Synthesis of Styrene-Terminated Tetraphenol Ethane (100% Vinylbenzyl) (STTPE( 100 VBz))

To a 2000 mL round bottom, 3-neck flask equipped with a mechanical stirrer, addition funnel, condenser, thermometer, Therm-O-Watch, drying tube and nitrogen purge was added 200.0 g of tetraphenol ethane ($Mn=274$, $Mw=711$) (0.284 moles), 1.88 g of BHT (0.00853 moles) and 950 mL of N-methyl pyrrolidinone (NMP). Upon dissolution of the TPE, 242.65 g (1.50 moles) of vinylbenzyl chloride (VBC) were added. The reaction mixture was heated to 60° C. and 101.95 g (1.590 moles) of potassium hydroxide in 230 mL of methanol were added dropwise over a 30 minute interval. The mixture was kept at 60° C. for an additional 4.75 hours. 15.17 g (0.0994 moles) of vinylbenzyl chloride was added. 6.37 g (0.0994 moles) of potassium hydroxide in 15 mL of methanol was then added dropwise over a 30 minute interval and the temperature maintained at 60° C. and additional 1.7 hours. 15.17 g (0.0994 moles) of vinylbenzyl chloride was added. 6.37 g (0.0994 moles) of potassium hydroxide in 15 mL of methanol was then added dropwise over a 30 minute interval and the temperature maintained at 60° C. and additional 1.0 hour.

The mixture was cooled and 1.2L of toluene were added. The mixture was washed once with 3L of water and twice with 3L of M sodium chloride solution. The organic phase was dried over sodium sulfate, filtered through Celite, filtered and concentrated under vacuum yielding 95% of resinous product, $Mn=778$, $Mw=1079$, dispersity of 1.39.

EXAMPLE 7

A series (Samples A, B , and C, below) of mixtures styrene terminated bisphenol-A formaldehyde (STBPA-F) of Example 2 and styrene terminated tetraphenolethane (STTPE) of Example 5 were cured prepared and cured via the following cure cycle: 2 hrs. at 80° C., 16 hrs. at 100° C., 4 hrs. at 120° C., 16 hrs. at 160° C., 2 hrs. at 200° C., and 1 hour at 225° C. and their properties were measured.

TABLE 1

| | STBPA-F:STTPE Properties | | |
|---|---|---|---|
| Sample No. | A | B | C |
| STBPA-F:STTPE | 90:10 | 75:25 | 50:50 |
| Tg (°C.)[a] | >300 | >300 | >300 |
| Tsp (°C.)[b] | 130 ± 5 | 134 ± 6 | 218 ± 7 |
| $\alpha_{sp}$ (ppm/°C.)[c] | 51 ± 3 | 66 ± 2 | 39 ± 2 |
| $\alpha_{260}$ (ppm/°C.)[d] | 62 ± 2 | 85 ± 2 | 44 ± 1 |
| $\epsilon'$[e] | 2.85 | 2.85 | 2.90 |
| tan $\delta$[f] | 0.0003 | 0.002 | 0.003 |
| $\epsilon'$[g] | 2.89 | 2.88 | 2.94 |
| tan $\delta$[h] | 0.002 | 0.002 | 0.003 |
| % Water Absorption[i] | 0.169 | 0.152 | 0.163 |

[a] Glass transition temperature by differential scanning calorimeter.
[b] Softening point by Thermo Mechanical Analysis - minor thermal transition.
[c] Coefficient of thermal expansion between 25° C. and softening point.
[d] Coefficient of thermal expansion between 25° C. and 260° C.
[e] Dielectric constant at 1 MHz and 0% Relative Humidity at 25° C.
[f] Loss tangent at 1 MHz and 0% Relative Humidity at 25° C.
[g] Dielectric constant at 1 MHz and 50% Relative Humidity at 25° C.
[h] Loss tangent at 1 MHz and 50% Relative Humidity at 25° C.
[i] At 50% Relative Humidity, 25° C. for 168 hours.

EXAMPLE 8

A 39.89% resins solids coating solution of 50:50 STBPA-F (Example 2):STTPE (Example 5) was prepared in toluene solution. The solution was applied to a silicon surface via spin coating at 1000 rpm for 60 seconds. The coated discs were soft baked at 25° C. for 18 hours under vacuum. Then, they were exposed for 3 minutes to UV irradiation with a 200 watt mercury vapor lamp with a quartz/water filter. The irradiated coatings and uncured coatings were then exposed to various solvents and the amount of resin dissolved was measured. The results are shown in the following tables.

TABLE 2

| | Dissolution Study of 50:50 STBPA-F:STTPE[a] | | | | | |
|---|---|---|---|---|---|---|
| Time | % STBPA-F/STTPE Removed Solvent | | | | | |
| (sec) | Toluene | Xylene | Cumene | Cyclohexane | Chlorobenzene | Hexane |
| 0 | 0 | 0 | 0 | 0 | 0 | 0 |
| 30 | 91.97 | 88.10 | 88.24 | 2.41 | 85.54 | −6.98 |
| 60 | 100.00 | 98.81 | 97.65 | 16.87 | 98.80 | 1.16 |
| 120 | 97.81 | 97.62 | 97.65 | 20.48 | 98.80 | 3.49 |
| 180 | 101.46 | 98.81 | 98.82 | 22.89 | 100.00 | 4.65 |
| 300 | 101.46 | 98.81 | 97.65 | 25.30 | 100.00 | 4.65 |

[a] 50:50 STBPA-F:STTPE coated on silicon wafter and soft baked at 25° C. for 18 Hrs.

TABLE 3

| | Dissolution Study of Photocured 50:50 STBPA-F:STTPE[a] | | | | | |
|---|---|---|---|---|---|---|
| Time | % STBPA-F/STTPE Removed Solvent | | | | | |
| (sec) | Toluene | Xylene | Cumene | Cyclohexane | Chlorobenzene | Hexane |
| 0 | 0 | 0 | 0 | 0 | 0 | 0 |
| 30 | 1.12 | 2.30 | −1.12 | −4.40 | 8.89 | −1.09 |
| 60 | 17.98 | 12.64 | 14.61 | 4.40 | 20.00 | 8.70 |
| 120 | 14.61 | 10.34 | 11.24 | −2.20 | 15.56 | 1.09 |
| 180 | 17.98 | 14.94 | 16.85 | 2.20 | 20.00 | 5.43 |
| 300 | 17.98 | 13.79 | 16.85 | 0.00 | 20.00 | 3.26 |

[a] 50:50 STBPA-F:STTPE coated on silicon wafter and soft baked at 25° C. for 18 Hrs, 3 minute cure 200 Watt Mercury Vapor Lamp with quartz/water filter.

TABLE 4

| | Dissolution Study of 50:50 STBPA-F:STTPE[a,b] | | | | |
|---|---|---|---|---|---|
| Time | % STBPA-F/STTPE Removed Solvent | | | | |
| (sec) | EtAc | BuAc | DMAc | DMF | Diglyme |
| 0 | 0 | 0 | 0 | 0 | 0 |
| 30 | 83.53 | 85.15 | 86.81 | 86.78 | 87.36 |
| 60 | 94.12 | 94.06 | 93.41 | 96.67 | 95.40 |
| 120 | 94.12 | 93.07 | 94.51 | 95.56 | 94.25 |
| 180 | 92.94 | 94.06 | 93.41 | 95.56 | 95.40 |
| 300 | 92.94 | 95.05 | 94.51 | 95.56 | 95.40 |

[a] 50:50 STBPA-F:STTPE coated on silicon wafer and soft baked at 25° C. for 18 Hrs.
[b] Ethanol rinse of sample after developing solvent exposure.

TABLE 5

| | Dissolution Study of Photocured 50:50 STBPA-F:STTPE[a,b] | | | | |
|---|---|---|---|---|---|
| Time | % TBPA-F/STTPE Removed Solvent | | | | |
| (sec) | EtAc | BuAc | DMAc | DMF | Diglyme |
| 0 | 0 | 0 | 0 | 0 | 0 |
| 30 | 11.11 | 8.70 | 21.65 | 18.18 | 19.78 |
| 60 | 23.33 | 21.74 | 24.74 | 21.59 | 20.88 |
| 120 | 16.67 | 16.30 | 18.56 | 13.64 | 16.48 |
| 180 | 20.00 | 20.65 | 23.71 | 18.18 | 18.68 |
| 300 | 20.00 | 19.57 | 22.68 | 19.32 | 16.48 |

[a] 50:50 STBPA-F:STTPE coated on silicon wafer and soft baked at 25° C. for 18 Hrs, 3 minute cure 200 Watt Mercury Vapor Lamp with quartz/water filter.
[b] Ethanol rinse of sample after developing solvent exposure.

TABLE 6

| | Dissolution Study of 50:50 STBPA-F:STTPE[a,b] | | |
|---|---|---|---|
| Time | % STBPA-F/STTPE Removed Solvent | | |
| (sec) | Nitromethane | 1-methoxy-2-propanol | EtOH |
| 0 | 0 | 0 | 0 |
| 30 | 32.95 | 46.59 | −3.33 |
| 60 | 47.73 | 63.64 | 4.44 |
| 120 | 50.00 | 68.18 | 3.33 |
| 180 | 51.14 | 69.32 | 3.33 |
| 300 | 54.55 | 70.45 | 3.33 |

[a] 50:50 STBPA-F:STTPE coated on silicon wafer and soft baked at 25° C. for 18 Hrs.
[b] Ethanol rinse of sample after developing solvent exposure.

TABLE 7
Dissolution Study of Photocured 50:50 STBPA-F:STTPE[a,b]

| Time (sec) | % STBPA-F/STTPE Removed Solvent | | |
|---|---|---|---|
| | Nitromethane | 1-methoxy-2-propanol | EtOH |
| 0 | 0 | 0 | 0 |
| 30 | 7.61 | 10.64 | 7.37 |
| 60 | 10.87 | 12.77 | 8.42 |
| 120 | 7.61 | 12.77 | 8.42 |
| 180 | 7.61 | 12.77 | 8.42 |
| 300 | 7.61 | 12.77 | 6.32 |

[a] 50:50 STBPA-F:STTPE coated on silicon wafer and soft baked at 25° C. for 18 Hrs, 3 minute cure 200 Watt Mercury Vapor Lamp with quartz/water filter.
[b] Ethanol rinse of sample after developing solvent exposure.

EXAMPLE 9

STBPA-F of Example 2 and STTPE of Example 5 was dissolved in toluene to yield a solution of composition 23.39 wt. % STBPA-F, 23.39 wt. % STTPE and 53.22 wt. % toluene. This solution was spin coated onto a silicon surface utilizing spin coating rates from 500 to 2000 rpm for 60 seconds; soft baked for 18 hours at 25° C. under vacuum. The samples were then exposed for 60 to 180 seconds to UV irradiation with a 200 watt mercury lamp employing an USAF Test Resolution Pattern and a quartz/water filter. The photocured polymer was then developed for 15 seconds to 45 seconds with butyl acetate (BuAc) or diglyme with an ethanol rinse at 25° C. The air dried substrate was hard baked employing a cure cycle under vacuum of 25° C. to 230° C. ramp in 2 hours, held at 230° C. for 1 hour and then cooled to room temperature over a 2 hour period.

The film thickness of the photocured polymer was analyzed employing a Taylor-Hobson Talysurf 10 profilometer.

TABLE 8

| Sample | Spin Speed (rpm) | UV Cure Time (secs.) | Developing Solvent | Developing Time (secs.) | Film Thickness ($\mu$m) |
|---|---|---|---|---|---|
| 1 | 500 | 120 | Diglyme | 45 | 16.2 |
| 2 | 500 | 180 | Diglyme | 30 | 18.0 |
| 3 | 500 | 120 | BuAc | 30 | 16.0 |
| 4 | 800 | 120 | BuAc | 30 | 12.5 |
| 5 | 800 | 90 | BuAc | 30 | 12.8 |
| 6 | 800 | 90 | Diglyme | 15 | 11.9 |
| 7 | 1000 | 90 | Diglyme | 15 | 10.3 |
| 8 | 1000 | 90 | BuAc | 15 | 11.0 |
| 9 | 1000 | 60 | BuAc | 15 | 10.8 |
| 10 | 1500 | 90 | BuAc | 15 | 9.2 |
| 11 | 1500 | 60 | BuAc | 15 | 9.0 |
| 12 | 1500 | 90 | Diglyme | 15 | 9.5 |
| 13 | 2000 | 90 | Diglyme | 15 | 11.2 |
| 14 | 2000 | 90 | BuAc | 15 | 8.3 |
| 15 | 2000 | 60 | BuAc | 15 | 8.1 |

I claim:

1. An electronic interconnect structure comprising electrical and dielectric levels wherein a cured polymer is the dielectric level, said polymer being produced by the method comprising:

a. coating a substrate with a mixture of prepolymers which comprises (1) an ether of the oligomeric condensation product of a dihydric phenol and formaldehyde having the formula

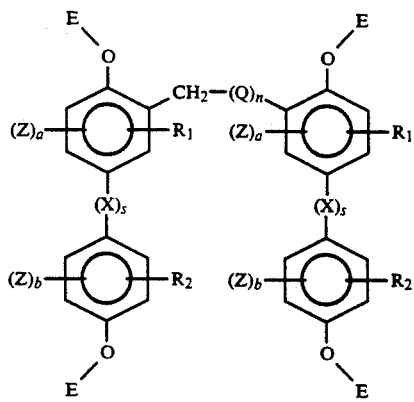

where the recurring unit Q has the structure,

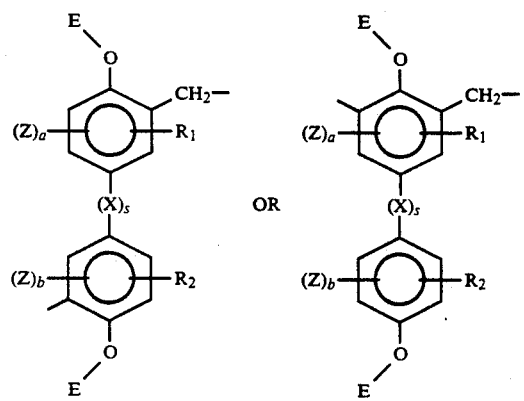

and n is an integer from 1 to 10;

s is 0 or 1;

each X is independently selected from the group consisting of $CH_2$, $C(CH_3)_2$, O, S, $SO_2$, CO, and $OC_6H_4O$;

each $R_1$ and $R_2$ is independently selected from the group consisting of hydrogen, alkyl and alkoxy moieties containing 1 to 10 carbon atoms, phenyl and phenoxy;

a and b are independently 0 or integers from 1 to 4;

Z is Cl or Br;

E is selected from the group consisting of the vinylbenzyl moiety, alkyl moieties containing 1 to 10 carbon atoms, or benzyl, subject to the constraint that at least 50% of all E's are the vinylbenzyl moiety; and (2) an ether of the oligomeric condensation product of (a) 1 molar proportion of a dialdehyde and (b) from about 3 to about 4 molar proportions of a phenol; when the dialdehyde is selected from the group consisting of $OHC(CH_2)_mCHO$, where m=0 or an integer from 1 to 6, cyclopentanedialdehyde, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde;

where the phenol has the structure $R_3C_6H_4$ and $R_3$ is hydrogen or an alkyl group containing from 1 to about 10 carbon atoms; and where the phenol residue of said oligomeric condensation product is etherified with one or more substituents to afford ether moieties randomly selected from the group consisting of vinylbenzyl, alkyl moieties containing from 1 to 10 carbon atoms, cycloalkyl moieties from 5 to 10 carbon atoms, and benzyl, with the ratio of vinylbenzyl to other moieties being from 1:1 to about 6:1;

c. irradiating the coated prepolymer of (a) through a masking pattern to selectively crosslink the portion of said coating being irradiated;

d. selectively dissolving the non-irradiated part of the prepolymer coating of (a); and e. curing the crosslinked portion of the prepolymer coating by heating at a temperature in the range of 100° C. to 300° C. for a time sufficient to further crosslink said crosslinked coating and to transform the prepolymer to an infusible glassy solid.

2. An electronic interconnect structure of claim 1 wherein said cured polymer is adhered to a chromium metal layer.

* * * * *